United States Patent [19]

Mori et al.

[11] Patent Number: 4,988,918
[45] Date of Patent: Jan. 29, 1991

[54] SHORT ARC DISCHARGE LAMP

[75] Inventors: Yasuki Mori, Yokohama; Yasuhiro Iwafuji, Hayama; Yoichiro Mitsuyuki, Tokyo; Tadatoshi Higashi, Yokohama, all of Japan

[73] Assignee: Toshiba Lighting and Technology Corporation, Tokyo, Japan

[21] Appl. No.: 369,343

[22] Filed: Jun. 21, 1989

[30] Foreign Application Priority Data

Jun. 23, 1988 [JP]  Japan ................... 63-155336
Jun. 23, 1988 [JP]  Japan ................... 63-155337
Jun. 23, 1988 [JP]  Japan ................... 63-155339

[51] Int. Cl.⁵ .................. H01J 61/20; H01J 61/073
[52] U.S. Cl. ............................. 313/641; 313/637; 313/620; 315/350
[58] Field of Search .......... 313/638, 640, 641, 642, 313/643, 637, 620; 315/151, 158, 159, 349, 350, 351

[56] References Cited

U.S. PATENT DOCUMENTS 4,612,475  9/1986  Downing ................ 313/640
4,732,842  3/1988  Kira ................ 313/642 X

FOREIGN PATENT DOCUMENTS 50-127267  4/1974  Japan .

OTHER PUBLICATIONS

"Point-Source Discharge Lamps for Photochemical Reaction", Mitsubishi Denki Technical Bulletin, vol. 44, No. 11; Takeda et al.; 12/70, pp. 1455-1460.

Primary Examiner—Kenneth Wieder
Attorney, Agent, or Firm—Cushman, Darby & Cushman

[57] ABSTRACT

Arc discharged by a short arc discharge lamp can be made so small in diameter as to appear like a spot. Therefore, the illuminance efficiency of the short arc discharge lamp can be made high and its brightness can also be enhanced.

14 Claims, 4 Drawing Sheets

SHORT ARC DISCHARGE LAMP

BACKGROUND OF THE INVENTION

1. Field of the Invention

The present invention relates to a short arc discharge lamp which is used as a light source for the lighting optical system such as the exposure device and UV spot cure, said exposure device serving to print electron circuit patterns on semiconductor wafers.

2. Description of the Related Art

The short arc discharge lamp including the superhigh pressure mercury lamp, xenon mercury lamp and the like usually has a bulb made of quartz glass and a pair of caps attached to the both ends of the bulb to keep the bulb air-tight. The center portion of the bulb is shaped like an egg. A pair of anode and cathode electrodes are mounted to oppose each other. A sight interval is provided between the anode and cathode electrodes to discharge short arc between them.

The short arc discharge lamp is a ultraviolet lamp capable of discharging small arc like a spot light source. Therefore, the short arc discharge lamp is combined with optical systems, which are provided with reflectors and the like, and used as various precise industrial means.

As disclosed in preliminarily-opened Japanese Patent Application Sho No. 60-57930, the exposure device for printing electron circuit patterns on semiconductor wafers has the short arc discharge lamp as its light source. The exposure device further includes a reflector for refecting and focusing light emitted from the discharge lamp, a plane mirror for reflecting light in different direction reflected by the reflector, a lens for focusing light reflected by the plane mirror, a photomask through which light focused by the focusing lens passes, and a semiconductor wafer onto which light passing through the photomask is focused and irradiated. The reflector has a quadric surface of revolution. The short arc discharge lamp is located substantially in the focus point of this reflector. The semiconductor wafer is coated with ultraviolet-sensitive resin.

A pattern of the photomask is printed on the surface of the semiconductor wafer by ultraviolet emitted from the short arc discharge lamp. Light is irradiated several times to expose one of the semiconductor wafers and high DC current is supplied to the discharge lamp only at the time when light is irradiated.

As disclosed in another preliminarily-opened Japanese Patent Application Sho No. 63-34897, the short arc discharge lamp is used for the projector. Current is applied to the short arc discharge lamp of the projector, synchronizing with the shutter of the projector. This current is converted to high level one only when the shutter is opened, and supplied to the discharge lamp. The short arc discharge lamp emits light of high brightness only when high level current is supplied to the lamp.

Industrial working machines have been asked these days to have high working accuracy, and they have also been asked to have high efficiency to enhance productivity. Super LSIs have been extremely highly integrated and the device for exposing semiconductors is thus asked to have high efficiency in the field of manufacturing semiconductors, too.

The strength or brightness of light on the surface of the semiconductor wafer is increased to enhance the exposing efficiency of the exposure device. Efficiencies of such means as the reflector and focusing lens are enhanced, while the output of the short arc discharge lamp is raised to increase the strength or brightness of light. Such means as the reflector has been completely improved, having an efficiency higher than a certain level. However, the short arc discharge lamp must be still improved. Conventionally, the strength of light increases to enhance the exposing efficiency by the short arc discharge lamp. A discharge lamp having a large light output has been thus developed and used as means for enhancing illuminance efficiency. A discharge lamp having a lamp input of 1 KW is therefore used instead of the amp having a lamp input of 500 W to shorten exposure time to half. The industrial machines provided with the discharge lamp enhance their efficiency in this manner.

In the case of the conventional short arc discharge lamp, however, power inputted become large when the output of the lamp is made high. Therefore, the discharge lamp cannot avoid its becoming large in size to release larger heat by means of increasing input power. When the discharge lamp is made large in size, its bulb also becomes large-sized and the diameter of arc discharged is also made large.

When the large-sized short arc discharge lamp is used in the exposure device which is asked to have high accuracy, light cannot be focused on the focusing point because the diameter of arc discharged is large. The light focusing ability of the exposure device is thus lowered and light is diffused on the surface of the semiconductor wafer. Therefore, the strength of light is not increased but lowered.

SUMMARY OF THE INVENTION

The object of the present invention is to provide a short arc discharge lamp wherein the diameter of arc discharged can be made small to increase the brightness of arc and enhance the efficiency of the lamp.

A short arc discharge lamp according to the present invention comprises an envelope formed of vitreous high temperature resistant material; an anode being sealed at one end of the envelope; a cathode being sealed at one end of the envelope; and a charge filling the envelope; the charge has at least mercury, rare gas, and halogen and said halogen has a partial molar quantity of $3.5 \times 10^{-5} \sim 3.5 \times 10^{-3}$ relative to mercury.

Another short arc discharge lamp according to the present invention comprises an envelope formed of vitreous high temperature resistant material; an anode being sealed at one end of the envelope; a cathode being sealed at one end of the envelope; and mercury and rare gas sealed in the envelope which is kept air-tight. This short arc discharge lamp has the following relation, $$(V_L - V_{SL})/l = 5 \sim 10 \text{ (V/mm) and}$$

$$D/W_L = 1.8 \sim 3.5 \text{ (cm/KW)},$$

providing that lamp voltage just after the start of lamp discharge is denoted by $V_{SL}$ (V), lamp voltage when discharge becomes stable by $V_L$ (V), interval between the anode and cathode electrodes by $l$ (mm), the largest inner diameter at the egg-shaped center portion of the bulb by D (cm), and lamp power when discharge becomes stable by $W_L$ (KW).

A further short arc discharge lamp according to the present invention comprises an envelope formed of vitreous high temperature resistant material; an anode being sealed at one end of the envelope; a cathode being sealed at one end of the envelope; a charge filling the envelope; and the charge has at least mercury, rare gas, and halogen, the halogen has a partial molar quantity of $3.5 \times 10^{-5} \sim 3.5 \times 10^{-3}$ relative to said mercury. This short arc discharge lamp has the following relation, $$(V_L - V_{SL})/l = 5 \sim 10 \text{ (V/mm) and}$$

$$D/W_L = 1.8 \sim 3.5 \text{ (cm/KW)},$$

providing that lamp voltage just after the start of lamp discharge is denoted by $V_{SL}$ (V), lamp voltage when discharge becomes stable by $V_L$ (V), interval between the anode and cathode electrodes by l (mm), the largest inner diameter at the egg-shaped center portion of the bulb by D (cm), and lamp power when discharge becomes stable by $W_L$ (KW).

The present invention enables arc discharged by the short arc discharge lamp to be made small in diameter to appear like a spot light source. Even when the illuminance output of the discharge lamp is lowered a little, therefore, its light focusing ability can be enhanced.

DETAILED DESCRIPTION OF THE PREFERRED EMBODIMENTS

Figure 1:
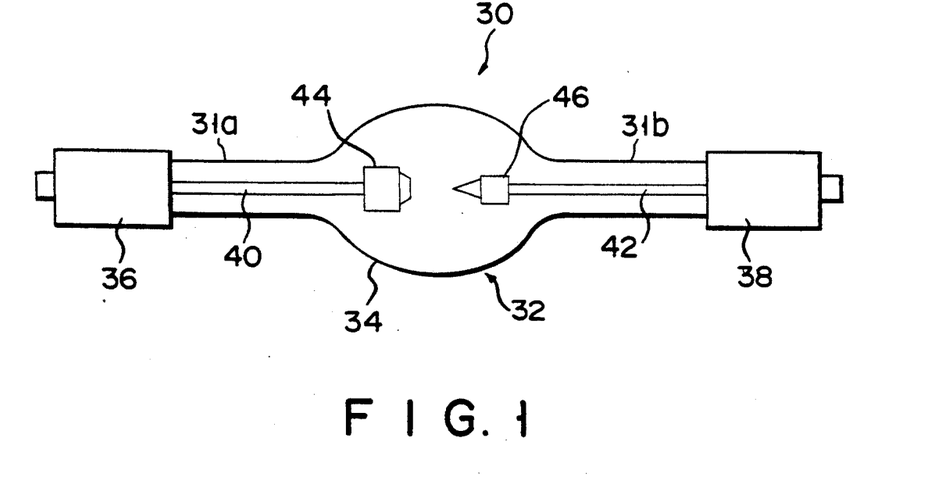
FIG. 1 is a plan view showing a first example of the short arc discharge lamp according to the present invention.

FIG. 1 shows a first example of the short arc discharge lamp according to the present invention. Discharge lamp 30 has bulb 32 made of quartz glass and pair of caps 36 and 38 attached to the both ends of bulb 32 to keep the inside of bulb 32 air-tight. Bulb 32 has sealing portions 31a, 31b continuous to the both ends of bulb 32, respectively. Center portion 34 of bulb 32 is egg-shaped. Electrode support rods 40 and 42 are electrically connected to caps 36 and 38, respectively. Anode and cathode electrodes 44 and 46 are attached to front ends of support rods 40 and 42 respectively. The front end of anode electrode 44 is shaped like a trapezoid, while that of cathode electrode 46 is shaped like a cone. Anode and cathode electrodes 44 and 46 are separated from each other by 3 mm to discharge short arc between them. The lamp voltage of this discharge lamp 30 is 50 V and its rated lamp input is 750 W. Mercury of $1.7 \times 10^{-4}$ mol/cc is sealed in bulb 32 and argon gas of 500 Torr, common temperature, is further sealed in it. The reason why argon gas is sealed in bulb 32 resides in preventing material of which the electrodes are made from being scattered by discharge. Further, iodide having a partial molar quantity of $3.5 \times 10^{-5} \sim 3.5 \times 10^{-3}$ as compared with mercury is sealed as halogen in bulb 32.

Mercury vapor, argon gas and iodide are mixed in short arc discharge lamp 32 at the time when it is turned on. When voltage is applied to anode and cathode electrodes 44 and 46, short arc discharge is started between them. This short arc discharge has the following characteristics. Iodide which serves as halogen is likely to combine with electrons because it is high in electron affinity. Halogen can thus reduce the number of electrons in arc. Therefore, arc can be formed at the shortest interval, where electron density is high, between electrodes 44 and 46, and arc thus formed can have a small diameter.

It is well known that arc is made unstable in case that halogen is sealed in the bulb when discharge is continued. However, in this embodiment, arc is neither flared nor made unstable because the interval between electrodes 44 and 46 is so short as to be 3 mm and because an appropriate quantity of iodide which serves as halogen is sealed in bulb 32. This prevents the discharge lamp from dying out.

Figure 2:
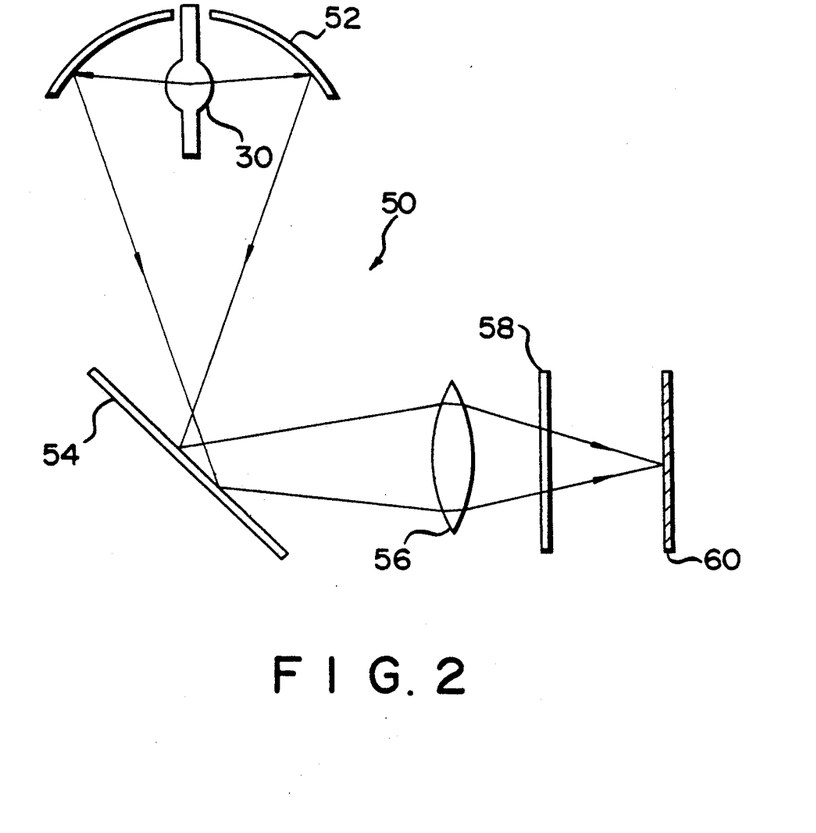
FIG. 2 shows the first discharge lamp used, as a second example, in the exposure device.

The following is an example in which short arc discharge lamp 30 is employed. This example shown in FIG. 2 is an exposure device for printing electron circuit patterns on semiconductor wafers. Exposure device 50 comprises short arc discharge lamp 30 which is used as the light source, reflector 52 for reflecting and focusing light emitted from discharge lamp 30, plane mirror 54 for reflecting the light sent from reflector 52, lens 56 for focusing the light reflected from plane mirror 54, and photomask 58 through which the light focused by lens 56 passes. Semiconductor wafer 60 is located at such a position that the light passes through photomask 58. Reflector 52 is formed to have a quadric surface of revolution. Discharge lamp 30 is located to discharge arc substantially in the center of reflector 52. Semiconductor wafer 60 is coated by ultraviolet-sensitive resin, for example, on the surface thereof.

The light emitted from discharge lamp 30 is reflected by reflector 52. The light reflected from reflector 52 is focused and then entered onto plane mirror 54. The light reflected in different direction by plane mirror 54 enters into focusing lens 56. The light from lens 56 passes through photomask 58 while it is being focused. The light which has passed through photomask 58 is radiated onto the surface of semiconductor wafer 60. The pattern of photomask 58 is thus printed on the surface of semiconductor wafer 60 by ultraviolet.

The most appropriated amount of halogen which was sealed in short arc discharge lamp 30 was obtained from the following test. The amount of iodide which was used as halogen was varied keeping the other condition same as in the above-described short arc discharge lamp. The state of discharge of G string (436 nm) was examined in this test, varying the amount of iodide and observing light strengths or densities on the surface of the semiconductor wafer. The amount of iodide was selected to have partial molar quantities of $2.0 \times 10^{-5}$, $3.5 \times 10^{-5}$, $3.5 \times 10^{-3}$ and $3.5 \times 10^{-2}$ relative to mercury. Results obtained by this test are shown in Table 1, in which No. 1 represents light strength, stability of arc and our valuation of the conventional discharge lamp, and those of our examples are denoted on the basis of these values of the conventional one. As apparent from the results, light strength cannot be enhanced because the amount of iodide sealed is small when the amount (partial molar quantity) of iodide is less than $3.5 \times 10^{-5}$. When the amount (partial molar quantity) of iodide exceeds $3.5 \times 10^{-5}$ however, light strength becomes high but arc sometimes dies out while flaring because its diameter is small.

Therefore, the appropriate amount of iodide is in a range of $3.5 \times 10^{-5} \sim 3.5 \times 10^{-3}$ when shown by the partial molar quantity of iodide relative to that of mercury. The most appropriate amount of iodide is in a range of $3.5 \times 10^{-4} \sim 2.0 \times 10^{-3}$.

According to the short arc discharge lamp, arc discharged is small in diameter. This makes its luminous area small and it appears a light source like a spot. Its brilliancy can be made high because the luminous efficiency of the discharge lamp is enhanced.

A second example of the short arc discharge lamp according to the present invention will be described. This second example has quite same arrangement as that of the first example but it is different in gases sealed from the first example. Samarium is sealed in the short arc discharge lamp in addition to those gases which were sealed in the first example of the short arc discharge lamp. This short arc discharge lamp, similar to the first example, is also used in the exposure device which serves to print patterns of semiconductor electron circuits on semiconductor wafers. Using the exposure device, a test was conducted about the second example of the short arc discharge lamp. It was examined how the light strength of arc of G string changed on the surface of the semiconductor wafer, depending upon whether or not samarium was present in the lamp. Table 2 shows results thus obtained.

As compared with Nos. 2 and 3 which have no samarium added in their discharge lamps, light strengths of Nos. 6 and 7 which have samarium added become higher. Therefore, samarium enables the spectrum of G string to be more strongly emitted, as compared with that in the first example of the short arc discharge lamp. As the result, the spectrum of 426 nm can be more strongly emitted than in the first example in which only iodide is added in the discharge bulb, thereby allowing Light output to be enhanced.

Gadolymium, praseodymium, lanthanum, yttrium, rhenium, terbium or europium may be used instead of samarium which was employed by the second example. The above-mentioned elements may be used as a unit or a combination of them. These metals such as samarium don't react with halogen but they are left as metal itself during the discharge of the lamp. When the discharge lamp is turned of, however, they react with halogen to form halogenides. This makes it possible for halogen and the metal such as samarium to be sealed, as a halogenide, from outside into the bulb.

Bromine, fluorine, chlorine and the like may be used as a unit or a combination of them instead of iodide which was used as halogen in the first and second examples.

Figure 3:
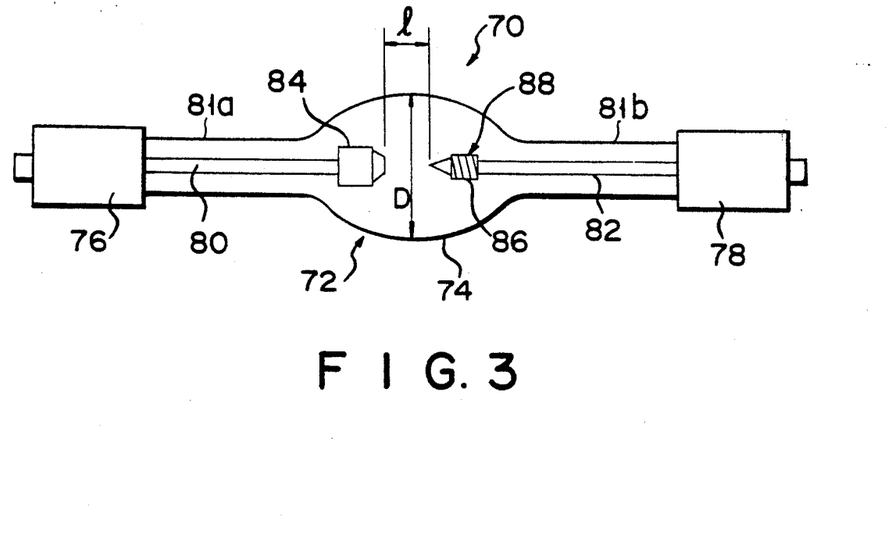
FIG. 3 is a plan view showing a third example of the short arc discharge lamp according to the present invention.

FIG. 3 shows a third example of the short arc discharge lamp according to the present invention. Discharge lamp 70 includes bulb 72 made of quartz glass, and a pair of caps 76 and 78 attached to the both ends of bulb 72 to keep the inside of bulb 72 air-tight. Bulb 72 has sealing portions 81a, 81b continuous to the both ends of bulb 72, respectively. The center portion of bulb 72 is egg-shaped. Electrode support rods 80 and 82 are electrically connected to caps 76 and 78, respectively, from outside. Each of support rods 80 and 82 is made of tungsten, for example. Anode and cathode electrodes 84 and 86 are attached to front ends of support rods 80 and 82. The front end of anode electrode 84 is shaped like a trapezoid and made of pure tungsten, while the front end of cathode electrode 86 is shaped like a cone and provided with coil 88 made of pure tungsten. An emitter made of $ThO_2$ is formed along the line of spiral coil 88. In the case of the discharge lamp shown in FIG. 3, interval l between anode and cathode electrodes 84 and 86 is 2.5 mm to discharge short arc between them. The maximum diameter D of egg-shaped center portion 74 of bulb 72 is 1.4 cm.

The rated lamp input of this discharge lamp 70 is 500 W. Argon gas is sealed in bulb 72 to keep bulb 72 at 0.5 atms under common temperature Mercury is sealed in bulb 72 to such an amount that makes lamp voltage 36 V. Argon gas is sealed in bulb 72 to prevent the material of the electrodes from being scattered by discharge in bulb 72.

Mercury vapor and argon gas are mixed in bulb 72 when short arc discharge lamp 70 is turned on. Mercury vapor pressure is 30 atms while argon gas pressure is 4 atms, and the total pressure in discharge lamp 70 is 34 atms. When voltage is applied to anode and cathode electrodes 84 and 86, short arc discharge is started between these electrodes 84 and 86. This short arc discharge has the following characteristic. Lamp voltage is $V_{SL} = 12[V]$ just after the discharge. It can be thought under this discharge state that voltage drop Vdrop because of electrode loss is 12[V] and that the influence of argon gas acting on lamp voltage is zero. Just after the discharge, therefore, lamp voltage $V_{SL} = Vdrop = 12[V]$.

Short arc discharge lamp 70, similar to the first example, is used for the exposure device which serves to print electron circuit patterns on semiconductor wafers. Description on the exposure device will be omitted because the arrangement of the exposure device is same as that in the first example of the short arc discharge lamp.

Test was conducted to enable short arc discharge lamp 70 to emit light at high efficiency. The state of discharge of G string (436 nm) on the surface of the semiconductor wafer was observed, varying conditions. Results thus obtained by this test are shown in Table 3. $V_{SL}$ denotes lamp voltage just after the lamp is turned on, $V_L$ lamp voltage at the time when discharge becomes stable, l the interval between the electrodes, $W_L$ lamp power at the time when discharge becomes stable, and D the maximum inner diameter of the egg-shaped center portion of the bulb. No. 15 in Table 3 represents a conventional example and its lamp illuminance, its total efficiency, our valuation of it and the like are shown in Table 3.

The conventional short arc discharge lamp denoted by No. 15 is under such conditions that lamp voltage $V_{SL} = 12V$ at the time when the lamp starts its discharge, lamp voltage $V_L = 50V$ at the time when discharge becomes stable, interval l between the electrodes = 3.6 mm, lamp power $W_L = 0.5$ KW at the time when discharge becomes stable, and maximum inner diameter D of bulb equals to 2.4 cm. In the case of this No. 15 discharge lamp, lamp illuminance is 100%, focusing efficiency is 16.7%. total efficiency is 100% and pressure in the bulb is 36 atms. As compared with No. 15 discharge lamp, No. 11 short arc discharge lamp has a lower lamp voltage $V_L$ which is 27V at the time when discharge becomes stable, a shorter interval l between the electrodes which is 3.1 mm, and a smaller maximum inner diameter D which is 1.0 cm. In the case of No. 11 discharge lamp, lamp illuminance is 68%, focusing efficiency is 24%, total efficiency is 98% and pressure in the bulb is atms. Therefore, No. 11 discharge lamp is lower in efficiency than No. 15 discharge lamp and it is out of the scope of the present invention. No. 12 short arc discharge lamp is different from No. 11 lamp in that interval l between the electrodes is set 3.0 mm. As the result, lamp efficiency becomes 71% and focusing efficiency becomes 23.8%. The total efficiency of No. 12 lamp is thus improved to 101%. Therefore, No. 12 lamp is made higher in efficiency than No. 15 conventional one. No. 13 short arc discharge lamp is different from No. 12 in that lamp voltage $V_L$ is made higher or 41V at the time when discharge becomes stable and that the maximum inner diameter D of the bulb is made larger or 1.6 cm. As the result, the efficiency of No. 13 lamp is made higher than No. 15 lamp because the lamp efficiency of No. 13 lamp is 85%, its focusing efficiency is 23.3% and its total efficiency is thus made 118%. No. 14 short arc discharge lamp is different from No. 13 lamp in that lamp voltage $V_L$ is set 36V at the time when discharge becomes stable and that maximum inner diameter D of the bulb is set 1.4 cm. As the result, the lamp illuminance of No. 14 lamp becomes 76%, its focusing efficiency 25%, and its total efficiency 114%. Therefore, the efficiency of No. 14 lamp is made higher than No. 15 lamp. No. 16 short arc discharge lamp is different from No. 14 lamp in that lamp voltage $V_L$ is set 50V at the time when discharge becomes stable and that maximum inner diameter D of the bulb is set 2.4 cm. As the result, the lamp efficiency of No. 16 lamp is made 100%, its focusing efficiency 19% and its total efficiency 114%. The problem of this No. 16 lamp resides in that the pressure in the bulb becomes 42 atms when No. 16 lamp is turned on. Namely, the pressure in the bulb becomes 8 atms (or 24%) higher than that of the conventional lamp. This asks the bulb itself to have higher strength. Therefore, No. 16 lamp is not suitable for use. No. 17 short arc discharge lamp is different from No. 16 lamp in that lamp voltage $V_L$ of No. 17 lamp is set 36V at the time when discharge becomes stable. As the result, the lamp efficiency of No. 17 lamp becomes 76%, its focusing efficiency 19% and its total efficiency 86%. Therefore, No. 17 lamp is lower in efficiency than No. 15 lamp.

Nos. 12–14 discharge lamps according to the present invention are arranged to have a shorter gap between the electrodes to become light sources like a spot, as compared with No. 15 conventional lamp. Lamp voltages of No. 12–14 discharge lamps are low at the time when discharge becomes stable. In other words, the amount of mercury sealed is small and potential tilt $(V_L - V_{SL})/l$ is made small. Therefore, lamp pressure at the time when the lamp is turned on is substantially same as that of the conventional lamp. Further, lamp illuminances of Nos. 12–14 discharge lamps become 15–29% lower than in the case of the conventional lamp. However, the value of $D/W_L$ is set smaller than in the case of the convention lamp and this enables the diameter of arc to be made smaller. As the result, the gap between the electrodes is made shorter and the spread of arc is made smaller, thereby allowing the arc to appear like a spot light source. Discharge lamps can be thus located in the focus point of the reflector of the exposure device with higher accuracy, thereby enabling their focusing efficiency to be enhanced. As compared with the conventional lamp, the short arc discharge lamps of the present invention can enhance their total efficiency to the extent of more 1–18%.

The diameter of the bulb becomes larger as the input power of the discharge lamp becomes larger in the case of the conventional discharge lamp. $D/W_L$ (cm/KW) usually equals to 4–6, for example, but when output becomes large, $D/W_L$ sometimes becomes larger than 4–6. This is because the pressure in the bulb is set so large as to come near the maximum pressure-resistant strength of the bulb and because the bulb shaped substantially like a sphere to enhance its pressure-resistant strength and to make its bulb wall load ($W_L$/inner surface area of the bulb) higher than a value large enough.

According to the present invention, however, total efficiency of the discharge lamp can be enhanced even when the pressure in the bulb is not set so high while the lamp is turned on. It is not needed therefore that the bulb is shaped like a sphere. In short, even when the bulb is shaped like a little longer spindle and its pressure-resistant strength is thus reduced a little, there is still the merit of stopping the spread of arc and making the diameter of arc small. As the result, all of efficiencies including that of the exposure device can be made higher.

Characteristics of the short arc discharge lamp will be described.

Pressure P in the bulb when the lamp is turned on usually depends upon gap l between the electrodes, the amount of mercury sealed, the pressure of rare gas sealed, and the temperature of the gas during discharging of the lamp. When the amount of mercury and gas sealed is increased, lamp voltage $V_L$ is raised. Lamp voltage can be expressed by the sum of electrode loss Vdrop and arc voltage Varc applied between the electrodes to generate arc.

$$V_L = V\text{drop} + V\text{arc} \qquad (1)$$

The quantity of light Φ generated by the discharge lamp is proportional to arc voltage Varc. Therefore, $$\Phi \propto V\text{arc}^a \qquad (2)$$

In order to increase the light quantity of the discharge lamp, therefore, arc voltage is increased.

Arc voltage Varc is proportional to the amount of mercury sealed and the pressure of rare gas sealed. Argon or xenon gas is used as rare gas in the short arc discharge lamp. This rare gas serves mainly to reduce starting voltage due to penning's effect and to limit the electrode-forming material to be scattered at the time when the lamp is started Pressure pgas of the rare gas sealed is kept lower than 1atm.

In the case of the short arc discharge lamp which uses xenon gas and mercury, however, xenon gas serves to prevent the electrode-making material from being scattered and the illuminance of xenon is also used when the lamp is turned on. Therefore, pressure Pgas of xenon gas sealed is thus kept higher than 1atm, most preferably in a range of 5–6 atms. The pressure increases 4 or 5 times while the discharge lamp is turned on.

As compared with mercury sealed, rare gas gives less influence to lamp voltage and just after discharge is started, $$V_{SL} = V_{drop} + V_{gas} \quad (3)$$

Even when the pressure of rare gas in the discharge lamp is at least 1atm at common temperature, in a range of 5-6 atms, for example Vgas is about several voltages. The pressure of rare gas increases 4-5 times during discharging of the lamp.

Arc voltage Varc can be expressed by the sum of Vgas which changes responsive to the pressure of gas sealed and VHg which changes responsive to the amount of mercury sealed. Namely, $$V_{arc} = V_{gas} + V_{Hg} \quad (4)$$

In the case of the short arc discharge lamp, therefore, $$V_{arc} \approx V_{Hg} \quad (5)$$

Assuming that the amount of mercury sealed is denoted by M(mg), the gap between the electrodes by 1 (mm), and the volume of the bulb by A(c:c), it is usually well known that VHg is in the relation of $$M \propto V_{Hg}^b \cdot A^d / l^c \quad (6)$$

Therefore, formula (6) can be re-written, $$V_{Hg} \propto M^e \cdot l^f / A^g \quad (7)$$

Pressure P in the bulb changes depending upon average temperature of gas in the bulb when the lamp is turned on, and assuming that temperature is certain, $$P \propto P_{gas} \quad (8)$$

$$P \propto M \quad (9)$$

Pressure P in the bulb becomes higher as pressure Pgas of rare gas is higher and the amount of mercury is larger. When lamp voltage $V_L$ is certain and gap l between the electrodes is small, it is needed that the amount of mercury is increased, as apparent from formula (6), and it is also needed that the amount of mercury is increased, as apparent from formulas (2) and (6), for the purpose of increasing arc voltage Varc to increase light quantity $\Phi$.

Lamp voltage $V_L$ may be made high to increase arc voltage Varc at same lamp power $W_L$. As apparent from formula (7), however, amount M of mercury is increased to make pressure P in the bulb high when the lamp is turned on. When pressure, P is increased while turning on the lamp, the strength of the bulb which can resist the pressure becomes lower and lower, thereby making high the possibility that the lamp breaks while it is discharging arc.

When gap or interval l between the electrodes is made large, it is supposed that light output can be increased without raising pressure P by increasing arc voltage Varc during the discharge of the lamp, but the characteristic of the lamp that discharges arc like a spot light source becomes poor. Therefore, its focusing efficiency obtained through a combination of optical system is lowered together with its total efficiency.

Further, a means for increasing the pressure of mercury can create the following demerit. When the pressure of mercury is increased, light output is raised. This causes the demerit of spreading arc and output at the continuous band of spectrum is increased but output at the ultraviolet band which is naturally essential is not necessarily increased in proportional rate. In other words, the increase of light output is caused by the increase of output at the unnecessary band and this does not means, therefore, that the efficiencies are truly enhanced.

According to the present invention, therefore, spreading of arc is restrained to make the diameter of arc small, so that all of the efficiencies including optical system of the lamp can be enhanced.

As described above, $(V_L - V_{SL})/l$ represents the potential tilt. This value is obtained taking interval l between the electrodes as the denominator. Therefore, this value determines whether or not arc can be formed as a light source like a spot. As understood from formulas (6), (7) and (8), this value is changed by the pressure of mercury vapor and, judging from the test results, it is quite right that this value is in a range of 5-10 (V/mm).

In the case of No. 11 lamp, for example, where $(V_L - V_{SL})/l$ is smaller than 5, interval l between the electrodes is too long or lamp voltage $V_L$ is too low at the time when discharge becomes stable. Therefore, arc in the short arc discharge lamp is not discharged like a spot-shaped light source, or the illuminance of the lamp becomes extremely low. The total efficiency is thus so lowered as not to achieve the object of the present invention.

In the case of No. 16 lamp for example where $(V_L - V_{SL})/l$ is larger than 10, the pressure in the bulb is raised while the discharge lamp is turned on. The reliability of the discharge bulb relative to pressure is thus lowered. This makes No. 16 lamp unsuitable for achieving the object of the present invention.

In the case of Nos. 12-14 lamps, for example, where $(V_L - V_{SL})/l$ is in a range of 5-10, the short arc discharge lamp capable of achieving the object of the present invention can be provided when $D/W_L$(cm/KW) is set 1.8-3.5. When $D/W_L$ is smaller than 1.8 in this case, the surface temperature of the bulb becomes too high and the pressure-resistant strength of the bulb is thus lowered. When $D/W_L$ is larger than 3.5, the total efficiency of the discharge lamp is lowered.

Lamp power $W_L$ per unit length is set to meet the above-mentioned conditions relating to $(V_L - V_{SL})/l$ and $D/W_L$. It is preferable in this case that $W_L/l$ is set larger than 0.17 to enhance the total efficiency of the discharge lamp.

In the case of this third example of the short arc discharge lamp, the pressure in the bulb is not raised while the discharge lamp is turned on, but the total efficiency is enhanced. The illuminance of the discharge lamp is lowered but the capacity of its serving as a spot light source is enhanced. The object of the present invention can be thus achieved by this third example.

Although the third example has been described as having a rated input of 500 W, it may have a rated input higher than 500 W. As the rated input becomes higher, the pressure-resistant ability of the bulb is more likely to be lowered. Therefore, the merit of making a discharge lamp which has a short interval between the electrodes can be used to the greatest extent according to the present invention.

A fourth example of the short arc discharge lamp according to the present invention will be described.

Figure 4:
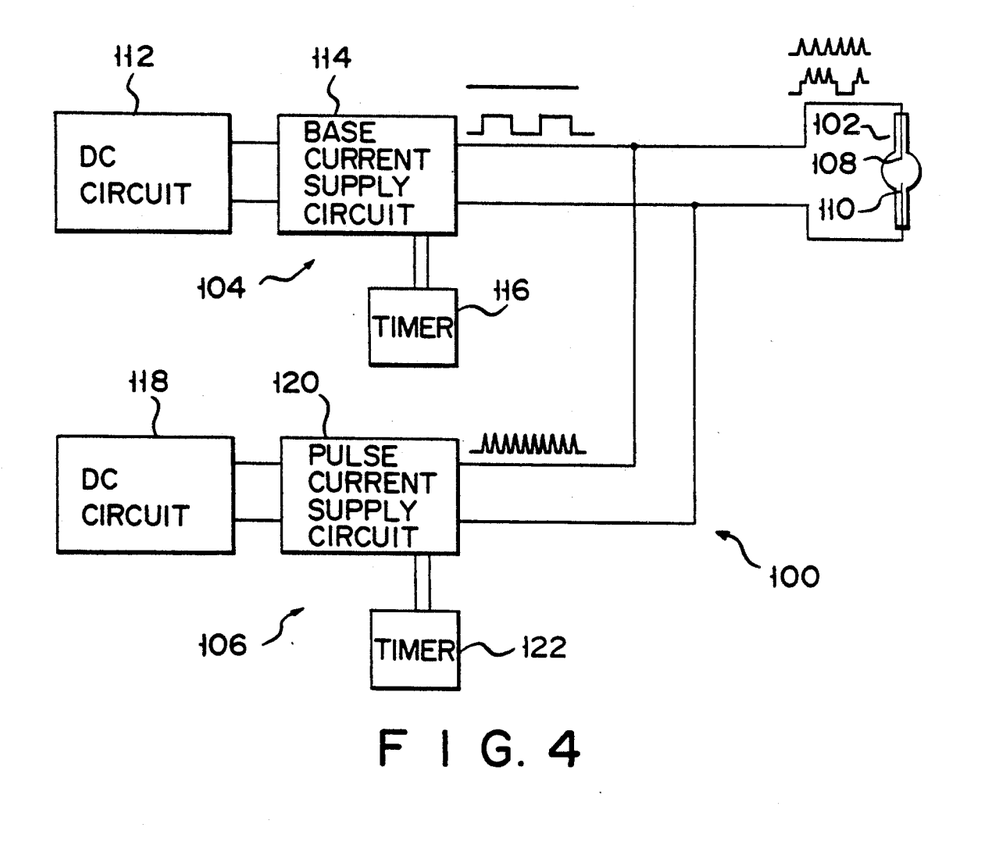
FIG. 4 shows a discharge circuit provided with a fourth example of the short arc discharge lamp according to the present invention.

FIG. 4 shows a lighting circuit in which the short arc discharge lamp is employed. Lighting circuit 100 has short arc discharge lamp 102 and two current supply circuits 104 and 106 connected to discharge lamp 102. Short arc discharge lamp 102 is same as described above embodiments. It has cathode and anode electrodes 108 and 110. Current supply circuit 104 has DC circuit 112 for supplying current, and base current supply circuit 114 for supplying a certain DC current picked up from the current supplied by DC circuit 112. Timer 116 is connected to base current supply circuit 114 to periodically change base current $I_B$. Current supply circuit 106 has DC circuit 118 for supplying DC current and pulse current supply circuit 120 for generating pulse current from the current supplied by circuit 118. Timer 122 is connected to circuit 120 to control the timing of generating pulse current $I_p$.

Figure 5:
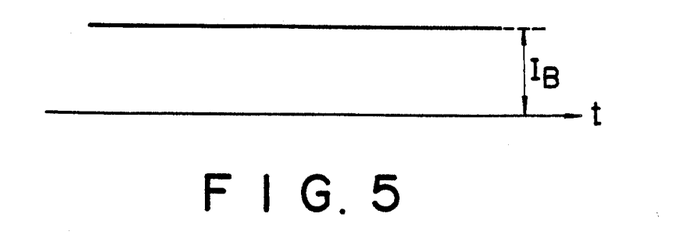
FIG. 5 is a graph showing base current $I_B$ supplied to the short arc discharge lamp.
Figure 6:
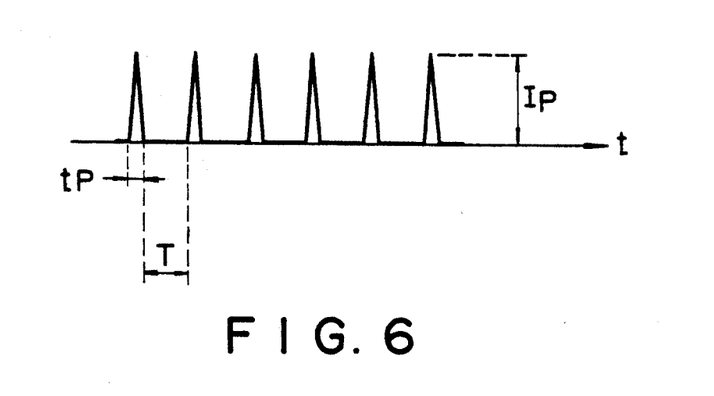
FIG. 6 is a graph showing pulse current $I_P$ supplied to the short arc discharge lamp.
Figure 7:
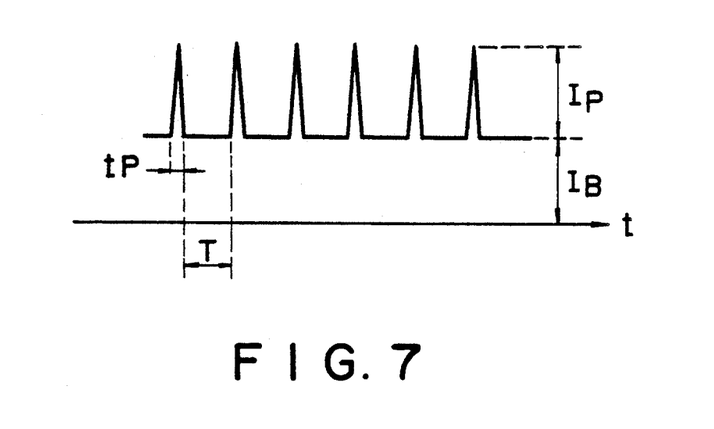
FIG. 7 is a graph showing the sum of base current $I_B$ and pulse current $I_P$.

Current circuit 104 serves to supply a certain base current $I_p$ to discharge lamp 102, as shown in FIG. 5. Current circuit 106 serves to supply pulse current $I_p$, which has pulse width tp, at period T during which no pulse is generated, as shown in FIG. 6. The sum of currents supplied from two circuits 104 and 106 is thus supplied to discharge lamp 102, as shown in FIG. 7.

Current supplied to discharge lamp 102 is set as follows.

$$0.03 \leq tp \leq 3 \text{ (ms)}$$

$$0.1 \leq T \leq 10 \text{ (ms)}$$

$$1.4 \leq I_P/I_B \leq 6$$

Base current is supplied to keep the discharge lamp arc-discharged. Metals such as mercury sealed are eft not condensed. Arc is being generated all the time and only when strong discharge is asked, pulse current is supplied to the lamp to generate stronger arc.

Test results obtained relating to this circuit are shown in Tables 4 and 5. Test results obtained relating to a DC discharge lamp and intended for comparison are also shown in them. A xenon lamp of about 1 KW is used as the short arc discharge lamp in Table 4. A superhigh pressure mercury lamp is used as the discharge lamp in Table 5. Illuminance efficiency per unit power on the DC discharge lamp is shown as 100 and those of other examples are shown as values relative to this value of 100 in Table 4. Further, the relative illuminance of the DC discharge lamp is shown as 100 and those of other examples are shown as values relative to this value of 100. As understood from Table 4, the discharge lamp in which discharge is carried out keeping its pulse width tp in a range of 0.03-3 (ms) is higher in efficiency than the DC discharge lamp. When T−tp becomes short, arc is continuously discharged, while when it becomes long, the interval between pulse currents becomes large. When the value of T−tp is in a range of 0.1-10 ms, therefore, best efficiency is obtained. The reason is as follows. Residual ions generated by the supply of a peak current cease to exist during such a period that no pulse current but only base current is supplied to the lamp, and a next peak current is then supplied to the lamp. Therefore, no discharge passage wider in the width direction of arc (or in a direction perpendicular to the electrodes) than the one formed while only base current is being supplied can be formed As the result, light radiated can be effectively used. When the value of $I_P/I_B$ is larger than 6, current applied to the xenon lamp shows large fluctuation. Anode and cathode electrodes 108 and 110 become more likely to be broken by heat, thereby causing the life of the xenon lamp to be made extremely short. When the value of $I_P/I_B$ is smaller than 1.4, the efficiency is not enhanced. It is therefore the best when the value of $I_P/I_B$ is in a range of 1.4–6. Results shown in Table 5 were obtained using the superhigh pressure mercury lamp as the discharge one and these results include times which the mercury lamp needed to harden photoresists. As compared with the DC discharge lamp, the superhigh pressure mercury lamp according to the present invention can shorten the time by 13% nice, maximum. Values most suitable for the present invention in Tables 4 and 5 are common to the xenon and superhigh pressure mercury lamps.

In the case of the above-described short arc discharge lamps, base current is supplied to the lamps all the time and pulse current is supplied to them every time T. Therefore, the width of arc does not become large. In other words, the short arc discharge lamps can make their illuminative area so small as to enable their arcs to look like a spot light source. Their light focusing efficiency, can be thus enhanced.

Figure 8:
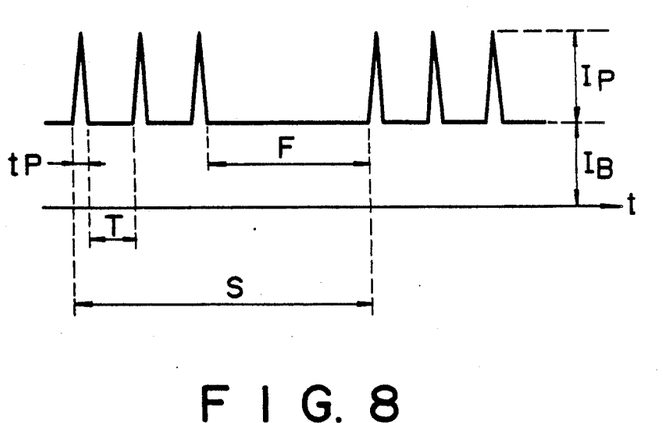
FIG. 8 is a graph showing the sum of base current $I_B$ and pulse current $I_p$ which is supplied in a cycle S and at a time interval F.

It is not needed that the interval at which pulse current is generated is certain all the time, as described above, but it may be arranged that pulse currents are generated a&: one cycle S, which includes rest interval F, as shown in FIG. 8. The interval between pulse currents is adjusted by timer 122. Materials onto which light is radiated being included in the ultraviolet drying machine or the like are under movement at interval F during which no pulse current is generated.

Figure 9:
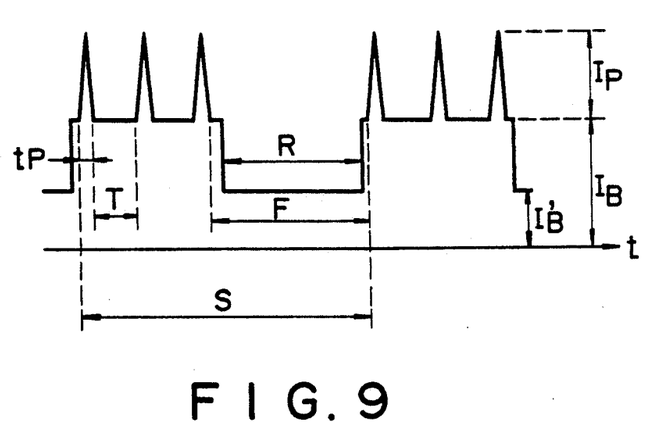
FIG. 9 is a graph showing the sum of base current, which is converted to low level current $I'_B$ supplied for a period R, and high level current $I_B$, and of pulse current IP supplied in the cycle S.

A variation of the above-described examples which are used in the lighting circuit will be described referring to FIG. 9. The lighting circuit in which the short arc discharge lamp is used is quite same as the one shown in FIG. 4. But it is different from the one shown in FIG. 4 only in that base current supplied from base current supply circuit 114 to discharge lamp 102 is changed Base current includes high level current $I_B$ and low level current $I'_B$. High level current $I_B$ is supplied to discharge lamp 102 for a period during which pulse currents are supplied to the lamp at a certain interval. Low level current $I'_B$ is supplied to the lamp for period R, which is interposed in interval F during which no pulse current is supplied to the lamp. Low level current $I'_B$ is current in the lowest level needed to keep the discharge lamp discharging arc. High level current $I_B$ same as base current in the above-described example shown in FIG. 4. Pulse current $I_P$ having pulse width tp is supplied to the discharge lamp several times at interval T. Base and pulse currents are supplied to discharge lamp 102 at cycle S. The relation of high level current $I_B$ with low level current $I'_B$ is $$I'_B/I_B \geq 0.2.$$

The interval during which base current is supplied to the lamp is adjusted by timer 116, while pulse current is adjusted by timer 122 of its supply interval Base and pulse currents are supplied to the lamp under the following conditions.

$$0.03 \leq tp \leq 3$$

$$0.1 \leq T \leq 10$$

$$1.4 \leq I_P/I_B \leq 6$$

When this variation of the lighting circuit is used, base current in low level is supplied to the lamp while matters which are radiated by light discharged by the discharge lamp are being conveyed and moved. Therefore, more power can be saved as compared with the fourth example of the present invention shown in FIG. 4. Further, current supplied to the short arc discharge lamp per unit time length can be reduced to thereby keep the lift of the discharge lamp longer The supply of base and pulse currents to the short arc discharge lamp is synchronized with the period during which matters irradiated by light are being conveyed and moved.

The above-described four examples of the short arc discharge lamp according to the present invention may be combined with one another. When the first and third examples are combined with each other, for example, the short arc discharge lamp thus provided has halogen sealed in its bulb and the following relation can be satisfied.

$$(V_L - V_{SL})/l = 5 \sim 10 (V/mm)$$

$$D/W_L = 1.8 \sim 3.5 (cm/KW)$$

Therefore, the short arc discharge lamp can make its arc slim. Namely, it can emit light with higher efficiency. The other examples may be similarly combined with each other and three or more examples may be combined with one another.

The short arc discharge lamp according to the present invention is not limited by the outputs mentioned above. Further, it is not needed that rare gas is sealed in the short arc discharge lamp to set the pressure in the lamp lower than 1 atm. It may be sealed in the lamp until the pressure in the lamp is set higher than 1 atm. The short arc discharge lamp of the present invention can be applied the UV spot cure and the like in addition to the exposure device for semiconductors.

According to the present invention, arc discharged by the short arc discharge lamp can be formed slim and its luminous area can be made like a spot. This enables the illuminance efficiency of the lamp to be made high together with its focusing efficiency. When the short arc discharge lamp of the present invention is used for the exposure device which is intended to print electro circuit patterns on semiconductor wafers, therefore, the focusing efficiency of the optical system itself can be enhanced together with the strength of light created. As the result, time needed to expose the patterns on semiconductor wafers can be shortened to thereby enhance the exposure efficiency.

TABLE 1

| | Amount of iodine sealed (Partial molar quantity relative to marcury) | Light strength rate (Percentage relative to conventional one) | Stability of arc | Valuation |
|---|---|---|---|---|
| No. 1 | $2.0 \times 10^{-5}$ | 100 | O | Δ |
| No. 2 | $3.5 \times 10^{-5}$ | 105 | O | O |
| No. 3 | $3.5 \times 10^{-3}$ | 125 | O | O |
| No. 4 | $3.5 \times 10^{-2}$ | 128 | x | x |

TABLE 2

| | Amount of iodine sealed (Partial molar quantity relative to mercury) | Samarium | Light strength rate |
|---|---|---|---|
| No. 2 | $3.5 \times 10^{-5}$ | Not present | 105 |
| No. 6 | $3.5 \times 10^{-5}$ | Present | 118 |
| No. 3 | $3.5 \times 10^{-3}$ | Not present | 125 |
| No. 7 | $3.5 \times 10^{-3}$ | Present | 131 |

TABLE 3

| | $V_L$ (V) | $V_{SL}$ (V) | l (mm) | $W_L$ (KW) | $W_L/l$ | $(V_L-V_{SL})/l$ | D (cm) | $D/W_L$ | Lamp illuminance A1 (%) | Focusing efficiency A2 (%) | Total efficiency A1 + A2 | Pressure in bulb when lamp is turned on (ATMS) | Valuation |
|---|---|---|---|---|---|---|---|---|---|---|---|---|---|
| No. 11 | 27 | 12 | 3.1 | 0.5 | 0.16 | 4.8 | 1.0 | 2.0 | 68 | 24 | 98 | 25 | x |
| No. 12 | 27 | 12 | 3.0 | 0.5 | 0.17 | 5.0 | 1.0 | 2.0 | 71 | 23.8 | 101 | 26 | O |
| No. 13 | 41 | 12 | 3.0 | 0.5 | 0.17 | 9.7 | 1.6 | 3.2 | 85 | 23.2 | 118 | 38 | O |
| No. 14 | 36 | 12 | 3.0 | 0.5 | 0.17 | 8.0 | 1.4 | 2.8 | 76 | 25 | 114 | 34 | O |
| No. 15 | 50 | 12 | 3.6 | 0.5 | 0.14 | 10.6 | 2.4 | 4.8 | 100 | 16.7 | 100 | 36 | x |
| No. 16 | 50 | 12 | 3.0 | 0.5 | 0.17 | 12.7 | 2.4 | 4.8 | 100 | 19 | 114 | 42 | x |
| No. 17 | 36 | 12 | 3.0 | 0.5 | 0.17 | 8.0 | 2.4 | 4.8 | 76 | 19 | 86 | 34 | x |

TABLE 4

| tp (ms) | T-tp (ms) | Ip/$I_B$ | Lamp power (W) | Relative illuminance (%) | Efficiency (%) |
|---|---|---|---|---|---|
| 3 | 10 | 1.4 | 1050 | 110 | 105 |
| 1 | 3 | 3 | 1000 | 111 | 111 |
| 0.5 | 2 | 4 | 1070 | 127 | 119 |
| 0.1 | 1 | 5 | 980 | 113 | 115 |
| 0.03 | 0.1 | 6 | 970 | 103 | 106 |
| DC Discharge lamp | | | 1000 | 100 | 100 |

TABLE 5

| tp (ms) | T-tp (ms) | Ip/$I_B$ | Lamp power (W) | Exposing time rate (%) |
|---|---|---|---|---|
| 3 | 10 | 1.4 | 710 | 93 |
| 1 | 3 | 3 | 680 | 88 |
| 0.5 | 2 | 4 | 690 | 87 |
| 1.0 | 1 | 5 | 710 | 89 |
| DC discharge lamp | | | 700 | 100 |

What is claimed is:

1. A short arc discharge lamp comprising:
   an envelope formed of a vitreous high temperature resistant material;
   an anode being sealed at one end of said envelope;
   a cathode being sealed at one end of said envelope; and
   a charge filling said envelope, said charge comprising at least mercury, rare gas, a halogen having a partial molar quantity of $3.5 \times 10^{-5}$–$3.5 \times 10^{-3}$ relative to mercury, and at least one of samarium, gadolinium, praseodymium, lanthanum, yttrium, rhenium, terbium, and europium.

2. The short arc discharge lamp according to claim 1, wherein said halogen is iodine.

3. The short arc discharge lamp according to claim 1, wherein halogen and metal such as samarium are sealed as halogenides in the bulb.

4. The short arc discharge lamp according to claim 1, wherein base and pulse currents $I_B$ and $I_p$ are supplied to the anode and cathode electrodes and base current is intended to cause the lamp to keep its discharge while pulse current having a pulse width tp is repeatedly supplied the lamp at a time interval T to cause the lamp to carry out its discharge with high brightness, and the following relation is established $$0.03 \leq tp \leq 3 \text{ (ms)}$$

$$0.1 \leq T \leq 10 \text{ (ms)}$$

$$1.4 \leq I_p/I_B \leq 6.$$

5. The short arc discharge lamp according to claim 1, wherein base and pulse currents are supplied to the anode and cathode electrodes, said base current is converted to current $I'_B$ in the lowest level needed to keep discharge and current $I_B$ in a level higher than the low level current $I'_B$ and supplied while the pulse current $I_P$ is being supplied, said pulse current $I_P$ is repeatedly supplied with the pulse width tp and at the time interval T to enable the lamp to carry out its discharge with high brightness, and the following relation is established, $$0.03 \leq tp \leq 3 \text{ (ms)}$$

$$0.1 \leq T \leq 10 \text{ (ms)}$$

$$1.4 \leq I_p/I_B \leq 6$$

$$I'_B/I_B \leq 0.2.$$

6. A short arc discharge lamp comprising:
an envelope formed of vitreous high temperature resistant material;
an anode being sealed at one end of said envelope;
a cathode being sealed at one end of said envelope; and
mercury and rare gas sealed in said envelope which is kept air-tight;
wherein providing that lamp voltage just after the start of lamp discharge is denoted by $V_{SL}(V)$, lamp voltage when discharge becomes stable by $V_L(V)$, interval between the anode and cathode electrodes by (mm), the largest inner diameter at the egg-shaped center portion of the envelope by D(cm), and lamp power when discharge becomes stable by $W_L(KW)$, $$(V_L - V_{SL})/l = 5 \sim 10 (V/mm) \text{ and}$$

$$D/W_L = 1.8 \sim 3.5 \text{ (cm/KW)}.$$

7. The short arc discharge lamp according to claim 6, wherein base and pulse currents $I_B$ and $I_P$ are supplied to the anode and cathode electrodes, said base current $I_B$ is intended to cause the lamp to keep its discharge while said pulse current $I_P$ is repeatedly supplied to the lamp with a pulse width tp and at a time interval T, and the following relation is established $$0.03 \leq tp \leq 3$$

$$0.1 \leq T \leq 10$$

$$1.4 \leq Tp/I_B \leq 6.$$

8. The short arc discharge lamp according to claim 6, wherein said base and pulse currents are supplied to the anode and cathode electrodes said base current is converted to current $I'_B$ in the lowest level needed to keep discharge and current $I_B$ in a level higher than the low level current $I'_B$ and supplied while said pulse current $I_P$ is being supplied to the electrodes, said pulse current $I_p$ is repeatedly supplied with the pulse width tp and at the time interval T to enable the lamp to discharge with high brightness, and the following relation is established $$0.03 \leq tp \leq 3 \text{ (ms)}$$

$$0.1 \leq T \leq 10$$

$$1.4 \leq I_p/I_B \leq 6$$

$$I'_B/I_B \leq 0.2.$$

9. A short arc discharge lamp comprising:
an envelope formed of vitreous high temperature resistant material;
an anode being sealed at one end of said envelope;
a cathode being sealed at one end of said envelope;
a charge filling said envelope; and
wherein said charge has at least mercury, rare gas and halogen, and said halogen has a partial molar quantity of $3.5 \times 10^{-5} \sim 3.5 \times 10^{-3}$ relative to said mercury, and
wherein providing that lamp voltage just after the start of lamp discharge is denoted by $V_{SL}$ lamp voltage when discharge becomes stable by $V_L(V)$, interval between the anode and cathode electrodes by 1 (mm), the largest inner diameter at the egg-shaped center portion of the envelope by D(cm), and lamp power when discharge becomes stable by $W_L(KW)$, $$(V_L - V_{SL})/l = 5 \sim 10 (V/mm) \text{ and}$$

$$D/W_L = 1.8 \sim 3.5 \text{ (cm/KW)}.$$

10. The short arc discharge lamp according to claim 9, wherein at least one metal of samarium, gadolinium, praseodymium, lanthanum, yttrium, rhenium, terbium and europium is sealed in the bulb.

11. The short arc discharge lamp according to claim 9, wherein said halogen is at least one of bromine, fluorine, chlorine, and iodine.

12. The short arc discharge lamp according to claim 9, wherein base and pulse currents $I_B$ and $I_P$ are supplied to the anode and cathode electrodes, said base current $I_B$ is intended to cause the lamp to keep its discharge, while said pulse current $I_P$ is repeatedly supplied to the lamp with a pulse width tp and at a time interval T, and the following relation is established, $$0.03 \leq tp \leq 3 \text{ (ms)}$$

$$0.1 \leq T \leq 10 \text{ (ms)}$$

$$1.4 \leq I_p/I_B \leq 6.$$

13. The short arc discharge lamp according to claim 9, wherein said base and pulse currents are supplied to the anode and cathode electrodes, said base current is converted to current $I'_B$ in the lowest level needed to keep discharge and current $I_B$ in a level higher than the low level current $I'_B$ and supplied while said pulse current $I_P$ is being supplied to the electrodes, said pulse current $I_P$ is repeatedly supplied with the pulse width tp and at the time interval T to enable the lamp to discharge with high brightness, and the following relation is established, $$0.03 \leq tp = 3 \text{ (ms)}$$

$$0.1 \leq T \leq 10 \text{ (ms)}$$

$$1.4 \leq I_P/I_B \leq 6$$

$$I'_B/I_B \leq 0.2.$$

14. The short arc discharge amp according to claim 10, wherein metals such as the halogen and samarium are sealed, as halogenides, in the bulb.

* * * * *